(12) United States Patent
Banin et al.

(10) Patent No.: US 10,707,880 B2
(45) Date of Patent: Jul. 7, 2020

(54) CIRCUIT, APPARATUS, DIGITAL PHASE LOCKED LOOP, RECEIVER, TRANSCEIVER, MOBILE DEVICE, METHOD AND COMPUTER PROGRAM TO REDUCE NOISE IN A PHASE SIGNAL

(71) Applicant: Intel IP Corporation, Santa Clara, CA (US)

(72) Inventors: Elan Banin, Raanana (IL); Tamar Marom, Petach Tikva (IL); Gil Horovitz, Emek-Hefer (IL); Rotem Banin, Even-Yehuda (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/077,087

(22) PCT Filed: Jan. 24, 2017

(86) PCT No.: PCT/IB2017/050361
§ 371 (c)(1),
(2) Date: Aug. 10, 2018

(87) PCT Pub. No.: WO2017/153852
PCT Pub. Date: Sep. 14, 2017

(65) Prior Publication Data
US 2019/0052279 A1    Feb. 14, 2019

(30) Foreign Application Priority Data

Mar. 11, 2016  (EP) .................... 16159964

(51) Int. Cl.
| H03L 7/091 | (2006.01) |
| --- | --- |
| H03L 7/085 | (2006.01) |
| H04L 7/033 | (2006.01) |
| H04L 7/04  | (2006.01) |

(52) U.S. Cl.
CPC .............. *H03L 7/091* (2013.01); *H03L 7/085* (2013.01); *H04L 7/0331* (2013.01); *H04L 7/048* (2013.01)

(58) Field of Classification Search
CPC .......... H04L 7/048; H04L 7/085; H04L 7/091
See application file for complete search history.

(56) References Cited

U.S. PATENT DOCUMENTS

| 5,796,392 | A | 8/1998 | Eglit | |
| --- | --- | --- | --- | --- |
| 6,122,607 | A * | 9/2000 | Ekudden | G10L 19/005 |
| | | | | 704/212 |
| 6,961,314 | B1 * | 11/2005 | Quigley | H04J 3/0682 |
| | | | | 370/252 |
| 7,339,984 | B1 | 3/2008 | Daou | |
| 2007/0076822 | A1 | 4/2007 | Miller et al. | |

(Continued)

*Primary Examiner* — Lincoln D Donovan
*Assistant Examiner* — Diana J. Cheng
(74) *Attorney, Agent, or Firm* — 2SPL Patent Attorneys PartG mbB; Kieran O'Leary (57) ABSTRACT

A circuit is configured to reduce a noise component of a measured phase signal. The circuit includes an input for a phase signal of an oscillator and an error signal estimator configured to determine parity information and an estimated error amplitude in the phase signal based on the parity information. The circuit further includes a combiner configured to provide the measured phase signal with the reduced noise component based on a combination of the phase signal and the estimated error amplitude.

22 Claims, 8 Drawing Sheets

(56) References Cited

U.S. PATENT DOCUMENTS

| | | |
|---|---|---|
| 2008/0172193 A1 | 7/2008 | Rhee |
| 2010/0171535 A1 | 7/2010 | Shanan |
| 2012/0200328 A1 | 8/2012 | Yao |
| 2015/0145568 A1 | 5/2015 | Tarighat et al. |
| 2015/0171895 A1 | 6/2015 | Pfau |

* cited by examiner

CIRCUIT, APPARATUS, DIGITAL PHASE LOCKED LOOP, RECEIVER, TRANSCEIVER, MOBILE DEVICE, METHOD AND COMPUTER PROGRAM TO REDUCE NOISE IN A PHASE SIGNAL

FIELD

Examples relate to circuits which reduce noise in an oscillator signal and in particular, but not exclusively, to a circuit, a digital phase locked loop, a receiver, a transceiver, a mobile device, a method and a computer program enabling reduction of spur noise or jitter in an oscillator signal.

BACKGROUND

Digital Phase Locked Loops (DPLLs) may provide a low-power-small-area solution relative to old fashion (analog) PLLs. In a DPLL the phase offset between a Local Oscillator (LO) and a reference clock is measured by an analog-to-digital convertor called Time-to-Digital Converter (TDC). The measured phase is then compared to the required phase and the result is used to correct the LO frequency. Due to the conversion to the digital domain, the phase measurement may suffer from aliasing. Aliased out-of-band noises are interpreted as in-band-noise, which may cause the control loop to inject wrong 'corrections'. These may cause actual in-band spurs that may limit the DPLL Phase-Noise (PN) performances.

BRIEF DESCRIPTION OF THE FIGURES

Some examples of apparatuses and/or methods and/or computer programs will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following some examples will be described which may make use of error signal detection in an output signal of an oscillator. In addition, out-of-band spur, as an example for noise, may be reduced using analog signal processing before converting to the digital domain, for example, in terms of an anti-aliasing filter or circuitry. In some examples of DPLLs, loop-filters may be used with a bandwidth to minimize or reduce an in-band-spur-effect, which may increase the effect of other noises. Examples may provide a circuit configured to estimate and reduce (or ideally remove) an aliased spur completely in the digital domain, examples of the circuit may be part of a larger analogue, or digital circuit or circuitry. Examples may provide a method or algorithm, which may use the knowledge of the frequency and a character of an out-of-band spur. Examples may mitigate out-of-band spur noise significantly or even completely.

Figure 1:
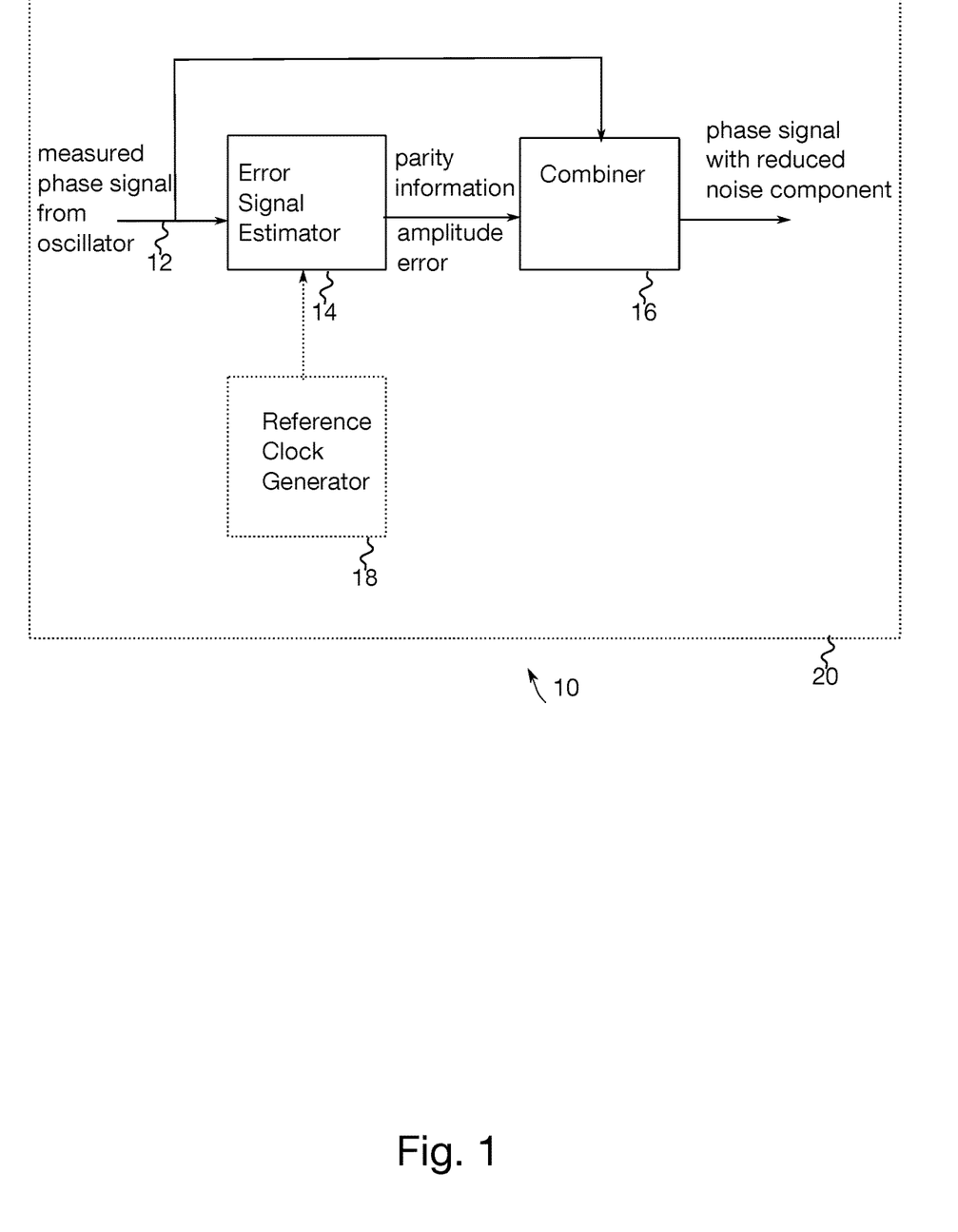
FIG. 1 illustrates an example of a circuit to reduce a noise component of a measured phase signal.

FIG. 1 illustrates an example of a circuit 10 to reduce a noise component of a measured phase signal. The circuit 10 comprises an input 12 for a phase signal of an oscillator. Such signal may be a sampled phase measurement and a sampling rate of the measurement may differ from a sampling rate of the oscillator signal. The measured phase signal may hence comprise digital samples of a phase of an oscillator output signal, which is, for example, to be controlled by a DPLL. The example of the circuit 10 may hence be used to modify a phase offset measurement in a DPLL. The phase offset may be measured between a LO and a reference clock using a TDC. The measured phase may be compared to a required phase and the result may be used to correct the LO frequency. Due to the conversion to the digital domain, the phase measurement may suffer from noise and/or aliasing, e.g. in terms of narrow band spurs. The circuit may reduce such impairment. The noise, aliasing, spurs, etc. will be referred to as noise components herein.

As can be further seen from FIG. 1, the input 12 is coupled to an error signal estimator 14. The error signal estimator 14 is configured to determine parity information, and an estimated error amplitude in the phase signal based on the parity information. The circuit 10 further comprises a combiner 16, which is coupled to the input 12 and to the error signal estimator 14. The combiner 16 is configured to provide the measured phase signal with the reduced noise component based on a combination of the phase signal and the estimated error amplitude.

The input 12 may be any contact, coupling, interface, connector, register, input/output port, pin, etc. that allows provision of a signal, for example, a digital signal. The error estimator 14 and/or the combiner 16 may be implemented using discrete digital components and/or one or more processing units, one or more processing devices, any means for processing, such as a processor, a computer or a programmable hardware component being operable with accordingly adapted software. In other words, the described function of the error signal estimator or the combiner may as well be implemented in software, which is then executed on one or more programmable hardware components. Such hardware components may comprise a general purpose processor, a Digital Signal Processor (DSP), a micro-controller, etc. Examples of the circuit may be implemented in hardware, e.g. using accordingly adapted hardware components such as one or more elements of the group of an Application Specific Integrated Circuit (ASIC), a Field Programmable Gate Array (FPGA), Read Only Memory (ROM) for storing software, Random Access Memory (RAM), and non-volatile storage, etc.

Figure 2:
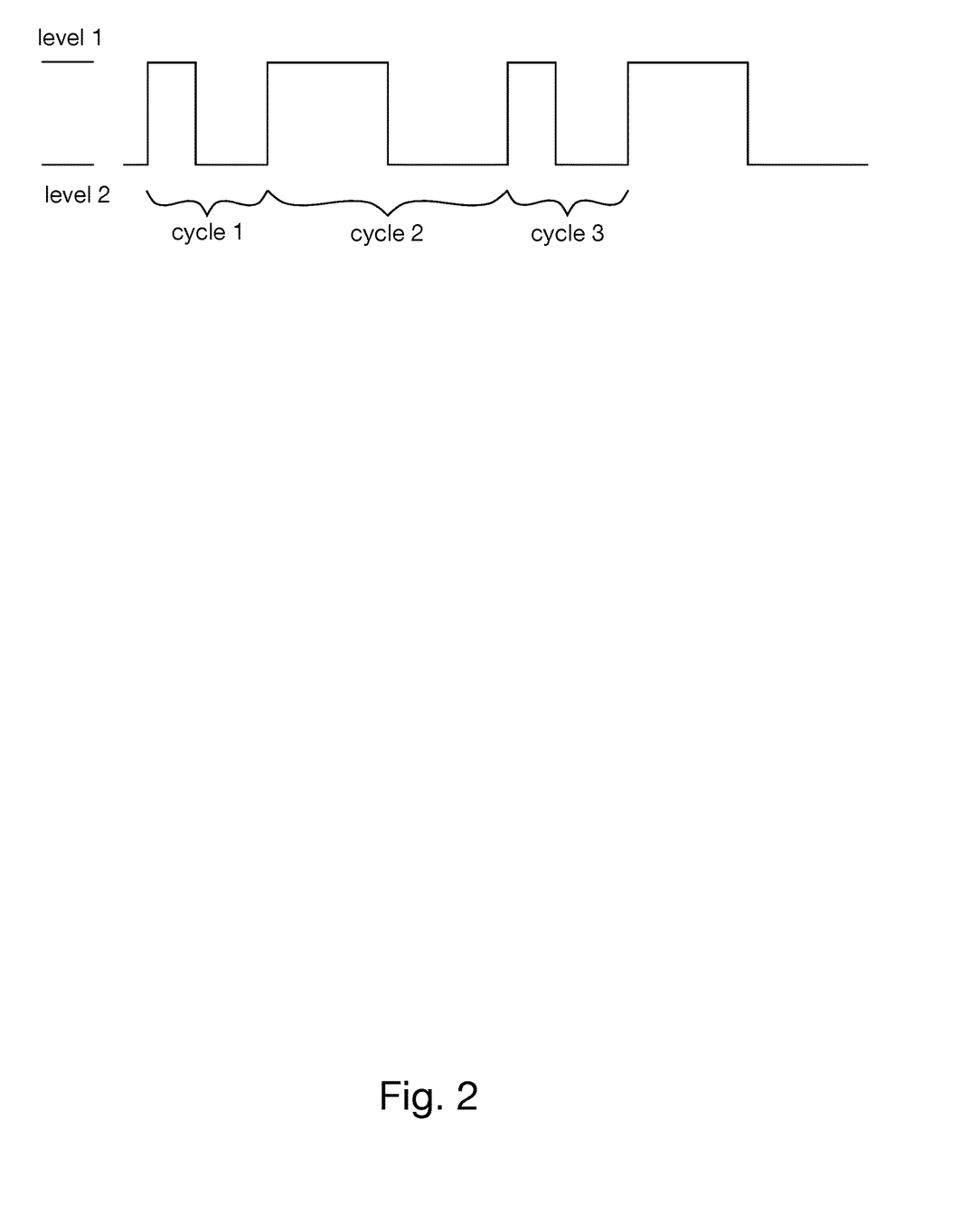
FIG. 2 shows an example of an oscillator output signal.

Examples may reduce a specific type of out-of-band noise and examples can be tailored to it. There are other types of out-of-band impairments examples may be implemented for. For example, a deterministic jitter of a PLL output clock may be an impairment that can be reduced with an example of the circuit shown in FIG. 1. The jitter may be characterized by short-cycle-long-cycle periodicity. With exaggeration, the LO clock may look something like shown in FIG. 2. FIG. 2 shows an output signal of a VCO, which is subdivided in cycles or period. As can be seen from FIG. 2 the signal in this example is a time continuous and value discrete signal, changing between two signal levels, labeled "level 1" and "level 2" in FIG. 2. One cycle or period is determined by two level changes. In FIG. 2 three subsequent cycles are referenced, "cycle 1", "cycle 2", and "cycle 3".

In order to remove the effect of the above described impairment from the measurements, examples may estimate two values, namely amplitude of the jitter (error amplitude relative to a nominal cycle length or phase error amplitude) and parity (information) of current cycle (even/odd). In an example the error signal estimator 14 is configured to determine the parity information as information on whether the phase signal is in an even or an odd cycle. In the following example, the LO clock is sampled by a reference clock, with different (usually much slower) sampling rate. The phase signal may hence be a sampled LO output signal, cf. FIG. 2, where the sampling rate of the phase signal is lower than the sampling rate of the LO output signal. Hence, a sample of the LO signal depicted in FIG. 2 may be taken in longer intervals than an average cycle in FIG. 2.

Each sample comes from an even or odd LO clock cycle. In FIG. 1 the reference signal generator 18, which is coupled to the error signal estimator 14, is shown as optional component (dashed line). The circuit 10 may comprise the reference clock generator 18. The reference signal generator 18 is configured to generate a reference clock signal with a reference sampling rate, the phase signal is a sampled version of an oscillator output signal, the oscillator output signal having a phase sampling rate, and the reference sampling rate is lower than the phase sampling rate. The parity information determined by the error signal estimator 14 may correspond to an even/odd value and may also be referred to as the 'parity' of the sample. In some examples, the measured phase signal may already be sampled by the reference clock at the input 12. In some examples the measured phase signal may at first be sampled by the phase sampling rate of the oscillator, e.g. by an LO, and the measured phase signal may again be down-sampled to reference edges only of the reference signal. The resulting data is then at the reference sampling rate.

In an example, the parity calculation is based on the parity of the previous sample and on the expected frequency ratio between the two clocks (the parity of first sample may be arbitrary). The error signal estimator 14 is then configured to determine the parity information based on a relation between the reference sampling rate and the phase sampling rate. Furthermore, the error signal estimator 14 can be configured to determine the parity information iteratively. Current parity information may be based on the relation between the reference sampling rate and the phase sampling rate, and previous parity information.

The error signal estimator 14 may be further configured to estimate the error amplitude by averaging a phase error of even and odd cycles of the phase signal. The amplitude may be estimated by averaging phase errors of even cycles and odd cycles separately. In some examples the error signal estimator 14 is configured to determine the phase error iteratively. An expected phase shift can be based on the relation between the reference sampling rate and the phase sampling rate, and a current phase shift can be based on a current and a previous phase of the phase signal. The error signal estimator may then be configured to determine the phase error based on the current phase shift and the expected phase shift.

The reduced noise may be a reduced spur (possibly resulting in a reduced jitter of an oscillator output signal at a DPLL) in the measured phase signal. The error signal estimator 14 may be configured to estimate a jitter gain as estimated error amplitude. The error signal estimator 14 can be configured to estimate different jitter gains for odd and even cycles of the phase signal. The jitter effect is then mitigated by adding/subtracting the error amplitudes from even/odd samples, respectively. The combiner 16 is then configured to combine the different jitter gains with the phase signal based on the odd and even cycles of the phase signal. FIG. 1 also illustrates an example of a DPLL 20 comprising an example of the circuit 10.

Figure 3:
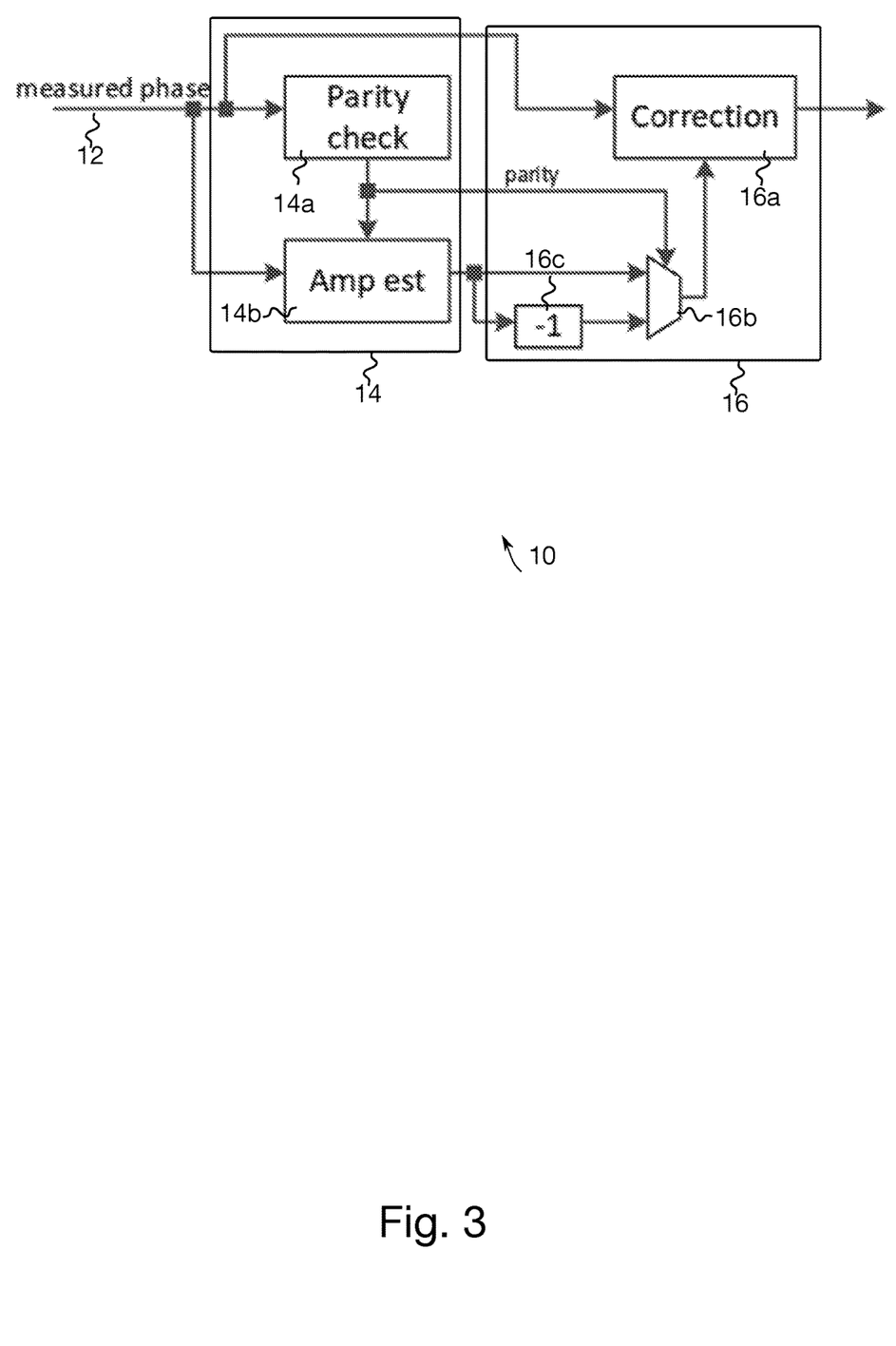
FIG. 3 illustrates another example of a circuit to reduce a noise component of a measured phase signal.

FIG. 3 illustrates another example of a circuit 10 to reduce a noise component of a measured phase signal. In the example shown in FIG. 3 the error signal estimator 14 is subdivided in a parity check module 14a and an amplitude estimation module 14b. The combiner 16 comprises a correction module 16a, a multiplexer 16b, and an inverter 16c. The diagram in FIG. 3 describes a high-level flow of an example algorithm or method.

The phase signal is input as measured phase to input 12, which is coupled to the inputs of the parity check module 14a, the amplitude estimator 14b and the correction module 16a. The parity check sub-block 14a detects if the current measured phase belongs to an even or odd LO cycle. The amplitude estimation sub-block 14b estimates the jitter gain.

Estimation is done by calculating a phase error of odd cycles and even cycles separately, and averaging each using a digital filter, such as any digital filter, e.g. an Infinite Impulse Response (IIR) filter, a Finite Impulse Response (FIR) filter, etc. The correction 16a removes or reduces the jitter from the measured phase, by addition or subtraction of the estimated gain according to the current parity. The output of the amplitude estimation module 14b is coupled to the multiplexer 16b via the inverter 16c and bypassing the inverter 16c. The multiplexer 16b can select whether the inverted output of the amplitude estimation module 14b is coupled to the correction module 16a or the un-inverted output of the amplitude estimation module 14b is coupled to the correction module 16a. The output of the parity check module 14a is coupled to the multiplexer 16b to determine the selection and the output of the parity check module 14a is also coupled to the amplitude estimation module 14b (to estimate the jitter gain for odd and even cycles, i.e. the different parities, separately).

The function of the parity check module 14a will be described in the following. A pseudo-code can be used to describe the parity calculation for each sample (initial parity is defined as 0). The parity information is information on whether the phase signal is in an even or an odd cycle. The described method further comprises generating a reference clock signal with a reference sampling rate (freq_ref), wherein the phase signal is a sampled version of an oscillator output signal, the oscillator output signal having a phase sampling rate (frequ_LO), and wherein the reference sampling rate (freq_ref) is lower than the phase sampling rate (frequ_LO). The parity information is determined based on a relation between the reference sampling rate (freq_ref) and the phase sampling rate (frequ_LO), in this example based on freq_LO/freq_ref, the ratio between LO clock and sampling clock of the reference signal. An expected phase shift between two adjacent samples can be determined as diff_exp=freq_LO/freq_ref−round(freq_LO/freq_ref).

The determining of the parity information is further done iteratively. Current parity information is based on the relation between the reference sampling rate and the phase sampling rate, and previous parity information. Likewise, the phase error (phase_error) is determined iteratively, wherein an expected phase shift (diff_exp) is based on the relation between the reference sampling rate and the phase sampling rate, wherein a current phase shift is based on a current phase (phase—input measured phase, phase signal) and a previous phase (phase_prev—previous measured phase) of the phase signal. The phase error is determined based on the current phase shift (phase) and the expected phase shift (diff_exp), hence.

phase_error=(phase−phase_prev)−diff_exp.

Furthermore, an expected parity change (due to clocks ratio), L1, can be determined as $L1=\mathrm{mod}(\mathrm{round}(\mathrm{freq\_LO}/\mathrm{freq\_ref}),2)$, and a parity change due to phase wrap-around, L2, can be determined as $L2=\mathrm{mod}(\mathrm{round}(\mathrm{phase\_error}),2)$.

The parity information can then be determined parity=mod($L1+L2$+parity_prev,2), wherein parity_prev corresponds to the parity of previous sample. This may be made clearer with an example, in which freq_LO/freq_ref=64.3, and diff_exp=0.3.

The following table shows the development of the respective parameters during a cycle.

| phase | 0 | 0.31 | 0.59 | 0.92 | 0.23 | 0.51 | 0.78 | 0.99 | 0.28 |
|---|---|---|---|---|---|---|---|---|---|
| phase_diff | — | 0.31 | 0.28 | 0.33 | −0.69 | 0.28 | 0.27 | 0.21 | −0.71 |
| diff_exp | 0.3 | 0.3 | 0.3 | 0.3 | 0.3 | 0.3 | 0.3 | 0.3 | 0.3 |
| phase_error | — | 0.01 | −0.02 | 0.03 | −0.99 | −0.02 | −0.03 | −0.09 | −1.01 |
| L1 | 0 | 0 | 0 | 0 | 0 | 0 | 0 | 0 | 0 |
| L2 | 0 | 0 | 0 | 0 | 1 | 0 | 0 | 0 | 1 |
| parity | 0 | 0 | 0 | 0 | 1 | 1 | 1 | 1 | 0 |

In the following the amplitude estimation 14b will be described in more detail. Another pseudo-code is used to describe the amplitude estimation (which is updated with every new sample) based on the above-introduced parameters:

phase_exp=mod(phase_exp_prev+diff_exp,1);

wherein phase_exp is the expected phase value given the previous expected-phase (phase_exp_prev) and the expected phase-step (given the clocks ratio). The phase_exp corresponds to accumulated integrated expected phase shifts (integration over diff_exp along the samples). The phase error then corresponds to phase_error=mod(phase−phase_exp+0.5,1)−0.5; % mod −0.5:0.5, where the error is mapped to the interval [−0.5 . . . 0.5]. Depending on the parity the amplitude can be estimated separately for odd and even cycles (amp_est_0, average amplitude of "even" samples phase error; amp_est_1, average amplitude of "odd" samples phase error). A forgetting filter (IIR) with a forgetting factor of alpha (alpha, IIR constant (used for averaging)) is additionally applied:

if parity==0 amp_est_0=(1-alpha)*amp_est_0_prev+ alpha*phase_error;

else amp_est_1=(1-alpha)*amp_est_1_prev+ alpha*phase_error;

end

The estimated jitter amplitude can then be determined as amp_est=(amp_est_0−amp_est_1)/2.

Figure 4:
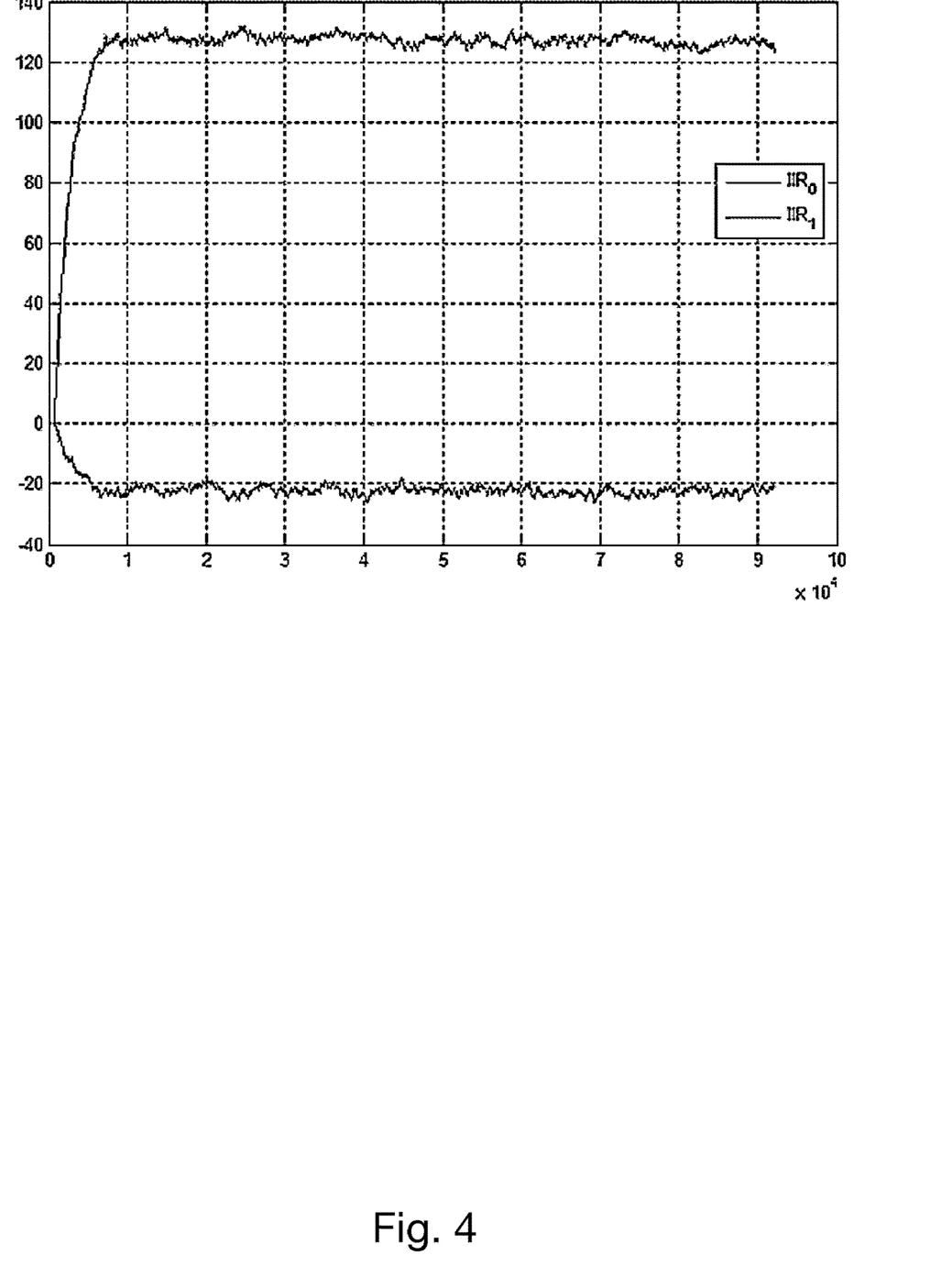
FIG. 4 illustrates simulation results for estimated phase error amplitudes.

The following Figs. illustrate simulation results. FIG. 4 illustrates simulation results for an estimated phase error amplitude. FIG. 4 shows subsequent samples on the x-axis (abscissa) and estimated phase error amplitude (relative to $2^{15}$) on the y-axis (ordinate). FIG. 4 shows the convergence of amp_est_0 (at the top $IIR_0$) and amp_est_1 (at the bottom $IIR_1$). The gap between them is defined as "amp_est". The viewgraph shows the outputs of the IIR filers (forgetting filters with factor alpha=1024 and a ratio between the LO frequency and the reference frequency of $N_{Target}$=freq_LO/freq_ref=71.0052). FIG. 4 illustrates how the filter outputs converge to the estimated jitter gains.

Figure 5:
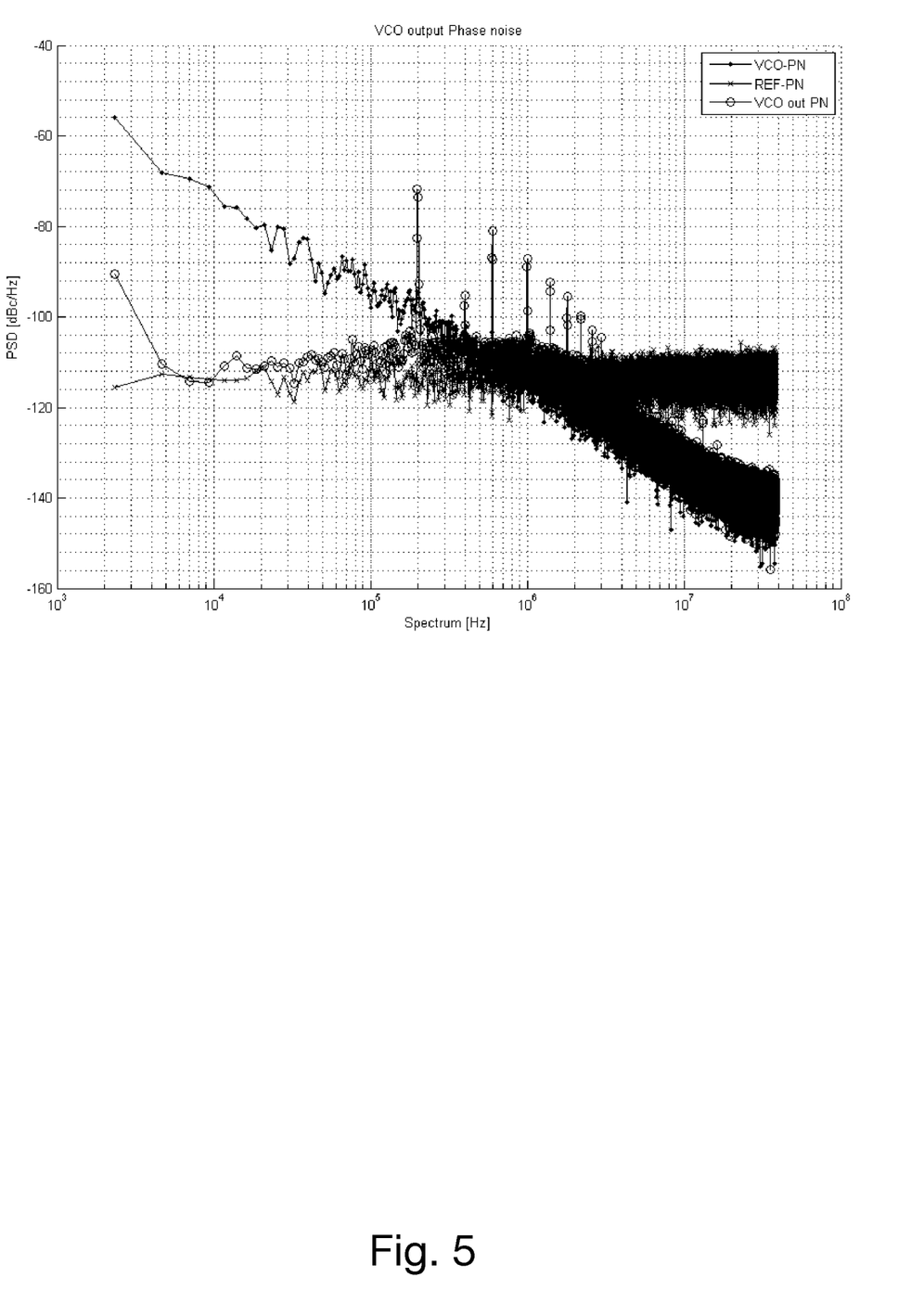
FIG. 5 shows simulation results for phase noise of a VCO, a reference clock generator, and a DPLL.
Figure 6:
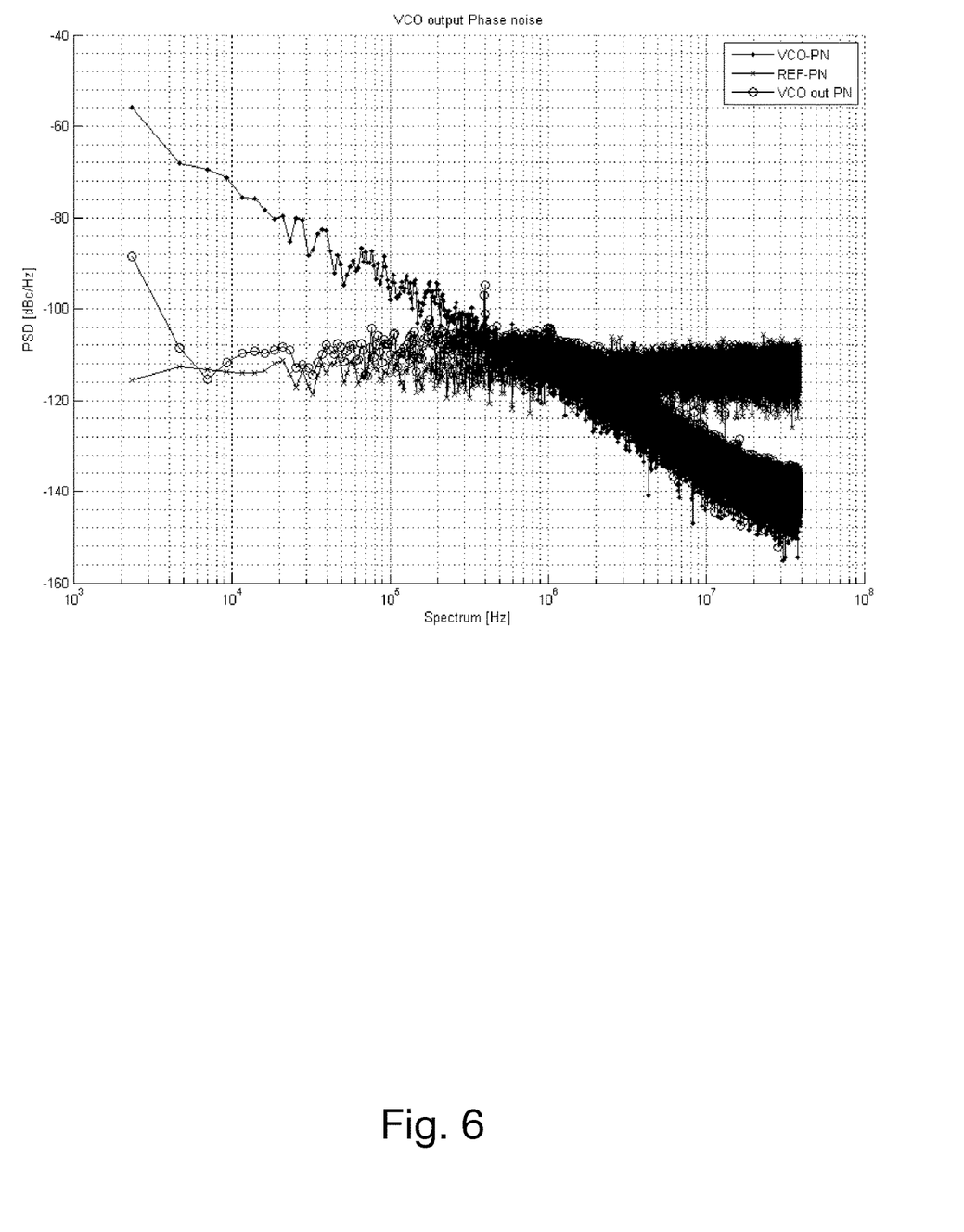
FIG. 6 shows simulation results for phase noise of a VCO, a reference clock generator, and a DPLL using an example of a noise reduction circuit.

The following FIGS. 5 and 6 show DPLL phase-noise spectra with and without the correction. FIGS. 5 and 6 show frequency on logarithmic scale on the x-axis (abscissa) and spectral power density in dB/Hz on the y-axis (ordinate).

Impairment values are taken from lab measurements at LO frequency of 5530 MHz. FIG. 5 shows simulation results for phase noise of a VCO (VCO-PN, "dot" markers), phase noise of a reference clock generator (REF-PN, "x" markers), and phase noise of a DPLL (VCO out PN, "circular" markers). FIG. 6 shows simulation results for phase noise of a VCO (VCO-PN, "dot" markers), a reference clock generator (REF-PN, "x" markers), and a DPLL (VCO out PN, "circular" markers) with an example of a noise reduction circuit according to the above description. The average Integrated Phase Noise levels at the VCO are IPN=−34.4 dB (FIG. 5 without the noise reduction), and IPN=−43.1 dB (FIG. 6 with the noise reduction). When comparing the spectra of FIGS. 5 and 6 for the phase noise of the VCO output, it can be seen how the spurs ("circular" markers sticking out in FIG. 5) have been reduced by the example.

Figure 7:
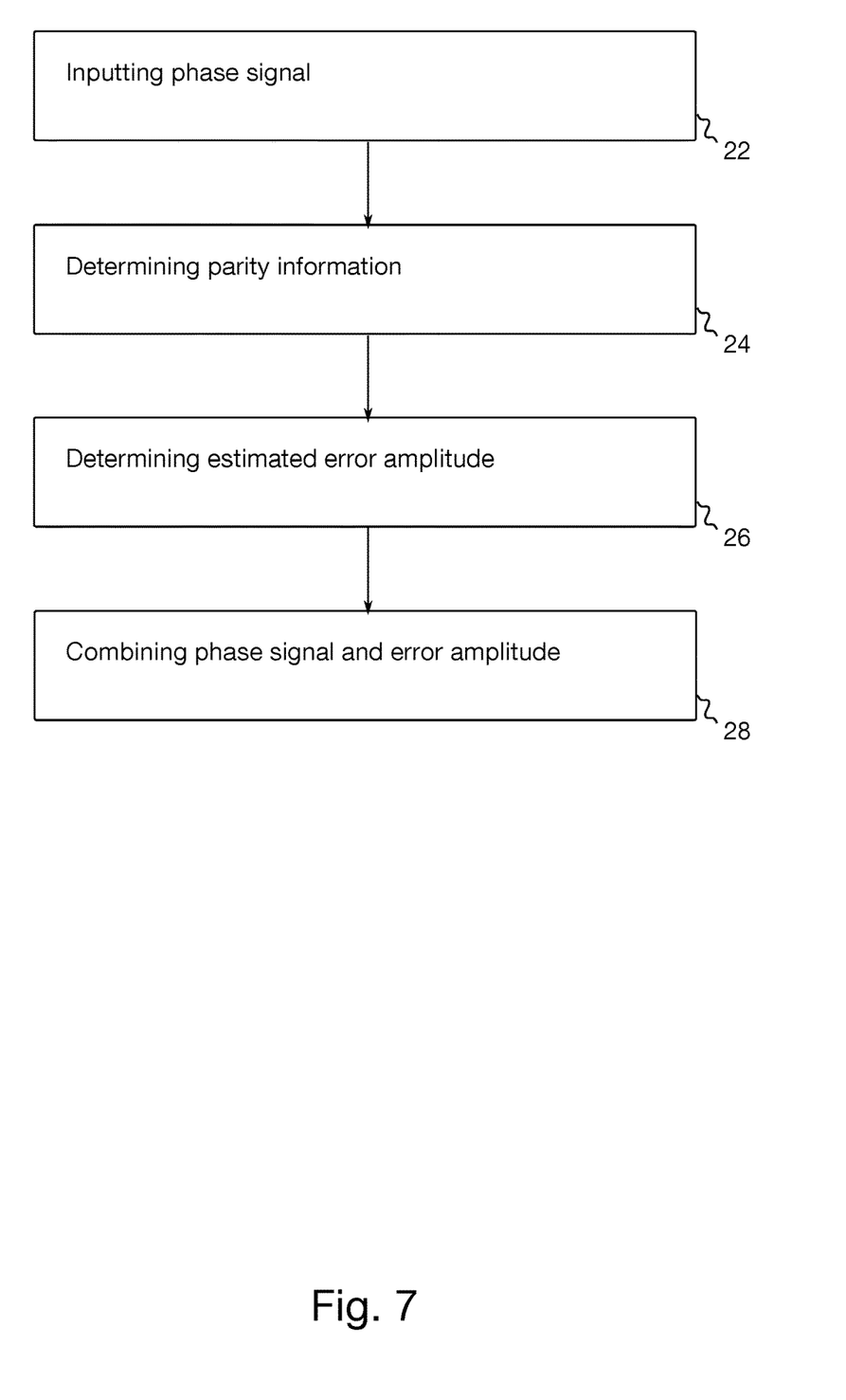
FIG. 7 shows a block diagram of an example of a method for reducing noise in a measured phase signal.

FIG. 7 shows a block diagram of an example of a method for reducing noise in a measured phase signal. The method comprises inputting 22 a phase signal of an oscillator and determining 24 parity information. The method further comprises determining 26 an estimated error amplitude in the phase signal based on the parity information. The method further comprises combining 28 the phase signal and the estimated error amplitude to provide the measured phase signal with the reduced noise component.

Examples further provide a computer program having a program code for performing at least one of the above methods, when the computer program is executed on a computer, a processor, or a programmable hardware component. A further example is a computer readable storage medium storing instructions which, when executed by a computer, processor, or programmable hardware component, cause the computer to implement one of the methods described herein.

Examples further provide an apparatus 10 for reducing a noise component of a measured phase signal, as depicted in FIG. 1. The apparatus 10 comprises a means for inputting 12 a phase signal of an oscillator. The means for inputting 12 is coupled with a means for determining 14 and a means for providing 16. The means for determining is coupled with the means for providing. The means for determining 14 is configured to determine parity information and an estimated error amplitude in the phase signal based on the parity information. The means for providing 16 is configured to provide the measured phase signal with the reduced noise component based on a combination of the phase signal and the estimated error amplitude. In another example the means for determining 14 is configured to determine the parity information as information on whether the phase signal is in an even or an odd cycle. Another example is a digital phase locked loop 20 comprising the apparatus 10.

Figure 8:
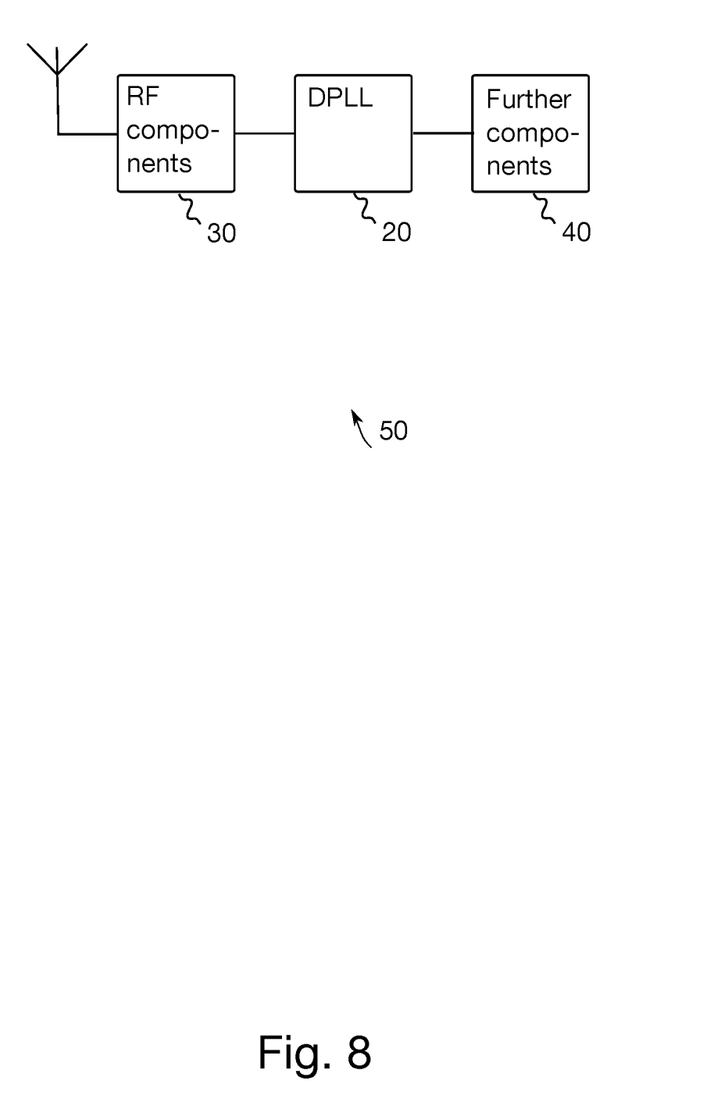
FIG. 8 shows an example of a receiver in a mobile device.

FIG. 8 shows an example of a receiver 50 comprising an example of the circuit 10 or the apparatus 10 in a digital phase locked loop 20. FIG. 8 illustrates a wireless transceiver 50 comprising radio frequency components 30 such as one or more elements of the group of one or more Low-Noise Amplifiers (LNAs), one or more Power Amplifiers (PAs), one or more filters or filter circuitry, one or more diplexers, one or more duplexers, one or more Analog-to-Digital converters (A/D), one or more Digital-to-Analog converters (D/A), one or more modulators or demodulators, one or more mixers, one or more antennas, etc. The radio frequency components 30 are coupled to the digital phase locked loop 20. The phase locked loop 20 is further coupled to further components 40, which may comprise one or more elements of the group of more filters or filter circuitry, further converters, one or more modulators or demodulators, one or more mixers, based band processing circuitry, one or more processors etc. Another example is a mobile device 50 comprising the radio frequency components 30, the digital phase locked loop 20 and the further components 40. Such a mobile device 50 may be a mobile transceiver, a smartphone, a cell phone, User Equipment (UE), a laptop, a notebook, a personal computer, a Personal Digital Assistant (PDA), a Universal Serial Bus (USB)-stick, a tablet computer, a car, etc. A mobile device or terminal may also be referred to as UE or user in line with the terminology used in the $3^{rd}$ Generation Partner-ship Project (3GPP).

The examples as described herein may be summarized as follows:

In a first example a circuit 10 to reduce a noise component of a measured phase signal comprises an input 12 for a phase signal of an oscillator. The circuit further comprises an error signal estimator 14 configured to determine parity information and an estimated error amplitude in the phase signal based on the parity information. The circuit further comprises a combiner 16 configured to provide the measured phase signal with the reduced noise component based on a combination of the phase signal and the estimated error amplitude.

In example 2 the error signal estimator 14 is configured to determine the parity information as information on whether the phase signal is in an even or an odd cycle.

In example 3 the circuit 10 comprises a reference clock generator 18 configured to generate a reference clock signal with a reference sampling rate, wherein the phase signal is a sampled version of an oscillator output signal, the oscillator output signal having a phase sampling rate, and wherein the reference sampling rate is lower than the phase sampling rate.

In example 4 the error signal estimator 14 is configured to determine the parity information based on a relation between the reference sampling rate and the phase sampling rate.

In example 5 the error signal estimator 14 is configured to determine the parity information iteratively, wherein current parity information is based on the relation between the reference sampling rate and the phase sampling rate and previous parity information.

In example 6 the error signal estimator 14 is configured to estimate the error amplitude by averaging a phase error of even and odd cycles of the phase signal.

In example 7 the error signal estimator 14 is configured to determine the phase error iteratively, wherein an expected phase shift is based on the relation between the reference sampling rate and the phase sampling rate, wherein a current phase shift is based on a current and a previous phase of the phase signal, and wherein the error signal estimator is configured to determine the phase error based on the current phase shift and the expected phase shift.

In example 8 the reduced noise is a reduced spur in the measured phase signal.

In example 9 the error signal estimator 14 is configured to estimate a jitter gain as estimated error amplitude.

In example 10 the error signal estimator 14 is configured to estimate different jitter gains for odd and even cycles of the phase signal.

In example 11 the combiner 16 is configured to combine the different jitter gains with the phase signal based on the odd and even cycles of the phase signal.

In example 12 an apparatus 10 for reducing a noise component of a measured phase signal, the apparatus 10 comprises a means for inputting 12 a phase signal of an oscillator. The apparatus 10 further comprises a means for determining 14 parity information and an estimated error amplitude in the phase signal based on the parity information. The apparatus 10 further comprises a means for providing 16 the measured phase signal with the reduced noise component based on a combination of the phase signal and the estimated error amplitude.

In example 13 the means for determining 14 is configured to determine the parity information as information on whether the phase signal is in an even or an odd cycle.

In example 14 a digital phase locked loop 20 comprises the circuit 10 or the apparatus 10 of the above examples.

In example 15 a receiver 50 or transceiver comprises the digital phase locked loop 20.

In example 16 a mobile device comprises the receiver 50 or transceiver.

In example 17 a method for reducing a noise component of a measured phase signal comprises inputting 22 a phase signal of an oscillator, determining 24 parity information, determining 26 an estimated error amplitude in the phase signal based on the parity information, and combining 28 the phase signal and the estimated error amplitude to provide the measured phase signal with the reduced noise component.

In example 18 the parity information is information on whether the phase signal is in an even or an odd cycle.

In example 19 the method further comprises generating a reference clock signal with a reference sampling rate, wherein the phase signal is a sampled version of an oscillator output signal, the oscillator output signal having a phase sampling rate, and wherein the reference sampling rate is lower than the phase sampling rate.

In example 20 the parity information is determined based on a relation between the reference sampling rate and the phase sampling rate.

In example 21 the determining 24 of the parity information is done iteratively, wherein current parity information is based on the relation between the reference sampling rate and the phase sampling rate, and previous parity information.

In example 22 the determining 24 of the estimated error amplitude is done by averaging a phase error of even and odd cycles of the phase signal.

In example 23 the phase error is determined iteratively, wherein an expected phase shift is based on the relation between the reference sampling rate and the phase sampling rate, wherein a current phase shift is based on a current and a previous phase of the phase signal, and wherein the phase error is determined based on the current phase shift and the expected phase shift.

In example 24 the reduced noise is a reduced spur in the measured phase signal.

In example 25 a jitter gain is estimated as estimated error amplitude.

In example 26 different jitter gains are estimated for odd and even cycles of the phase signal.

In example 27 the different jitter gains are combined with the phase signal based on the odd and even cycles of the phase signal.

In example 28 a computer program has a program code for performing at least one of the methods described herein, when the computer program is executed on a computer, a processor, or a programmable hardware component.

In example 29 a machine readable storage includes machine readable instructions, when executed, to implement a method or realize an apparatus as described herein.

In example 30 a machine readable medium includes code, when executed, to cause a machine to perform one more of the methods described herein.

A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, exemplify the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing", "means for determining", "means for inputting", etc., may be provided through the use of dedicated hardware, such as "a signal provider", "a signal processing unit", "a processor", "a controller", "a determiner", "an input", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry exemplify the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. There-fore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A circuit to reduce a noise component of a measured phase signal, the circuit comprising:
   an input for a phase signal of an oscillator;
   an error signal estimator configured to determine parity information and an estimated error amplitude in the phase signal based on the parity information wherein the error signal estimator is configured to determine the parity information as information on whether the phase signal is in an even or an odd cycle; and
   a combiner configured to provide the measured phase signal with the reduced noise component based on a combination of the phase signal and the estimated error amplitude.

2. The circuit of claim 1, comprising a reference clock generator configured to generate a reference clock signal with a reference sampling rate, wherein the phase signal is a sampled version of an oscillator output signal, the oscillator output signal having a phase sampling rate, and wherein the reference sampling rate is lower than the phase sampling rate.

3. The circuit of claim 2, wherein the error signal estimator is configured to determine the parity information based on a relation between the reference sampling rate and the phase sampling rate.

4. The circuit of claim 3, wherein the error signal estimator is configured to determine the parity information iteratively, wherein current parity information is based on the relation between the reference sampling rate and the phase sampling rate and previous parity information.

5. The circuit of claim 4, wherein the error signal estimator is configured to estimate the error amplitude by averaging a phase error of even and odd cycles of the phase signal.

6. The circuit of claim 5, wherein the error signal estimator is configured to determine the phase error iteratively, wherein an expected phase shift is based on the relation between the reference sampling rate and the phase sampling rate, wherein a current phase shift is based on a current and a previous phase of the phase signal, and wherein the error signal estimator is configured to determine the phase error based on the current phase shift and the expected phase shift.

7. The circuit of claim 1, wherein the reduced noise is a reduced spur in the measured phase signal.

8. The circuit of claim 7, wherein the error signal estimator is configured to estimate a jitter gain as estimated error amplitude.

9. The circuit of claim 8, wherein the error signal estimator is configured to estimate different jitter gains for odd and even cycles of the phase signal.

10. The circuit of claim 9, wherein the combiner is configured to combine the different jitter gains with the phase signal based on the odd and even cycles of the phase signal.

11. A digital phase locked loop comprising the circuit of claim 1.

12. A method for reducing a noise component of a measured phase signal, the method comprising:
    inputting a phase signal of an oscillator;
    determining parity information;
    determining an estimated error amplitude in the phase signal based on the parity information wherein the parity information is information on whether the phase signal is in an even or an odd cycle; and
    combining the phase signal and the estimated error amplitude to provide the measured phase signal with the reduced noise component.

13. The method of claim 12, further comprising generating a reference clock signal with a reference sampling rate, wherein the phase signal is a sampled version of an oscillator output signal, the oscillator output signal having a phase sampling rate, and wherein the reference sampling rate is lower than the phase sampling rate.

14. The method of claim 13, wherein the parity information is determined based on a relation between the reference sampling rate and the phase sampling rate.

15. The method of claim 14, wherein the determining of the parity information is done iteratively, wherein a current parity information is based on the relation between the reference sampling rate and the phase sampling rate, and a previous parity information.

16. The method of claim 15, wherein the determining of the estimated error amplitude is done by averaging a phase error of even and odd cycles of the phase signal.

17. The method of claim 16, wherein the phase error is determined iteratively, wherein an expected phase shift is based on the relation between the reference sampling rate and the phase sampling rate, wherein a current phase shift is based on a current and a previous phase of the phase signal, and wherein the phase error is determined based on the current phase shift and the expected phase shift.

18. The method of claim 12, wherein the reduced noise is a reduced spur in the measured phase signal.

19. The method of claim 18, wherein a jitter gain is estimated as estimated error amplitude.

20. The method of claim 19, wherein different jitter gains are estimated for odd and even cycles of the phase signal.

21. The method of claim 20, wherein the different jitter gains are combined with the phase signal based on the odd and even cycles of the phase signal.

22. A non-transitory machine readable storage medium including program code, when executed, to cause a machine to perform a method for reducing a noise component of a measured phase signal, the method comprising:
- inputting a phase signal of an oscillator;
- determining parity information;
- determining an estimated error amplitude in the phase signal based on the parity information wherein the parity information is information on whether the phase signal is in an even or an odd cycle; and
- combining the phase signal and the estimated error amplitude to provide the measured phase signal with the reduced noise component.

* * * * *